United States Patent
Camporese et al.

(10) Patent No.: US 6,205,571 B1
(45) Date of Patent: Mar. 20, 2001

(54) X-Y GRID TREE TUNING METHOD

(75) Inventors: Peter J. Camporese, Hopewell Junction; Alina Deutsch, Chappagua; Timothy Gerard McNamara, Fishkill; Phillip John Restle, Katonah; David Allan Webber, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/222,143

(22) Filed: Dec. 29, 1998

(51) Int. Cl.[7] ........................................................ G06F 17/50

(52) U.S. Cl. .................................................. 716/2; 716/14

(58) Field of Search ........................... 395/500.15; 716/2, 716/14

(56) References Cited

U.S. PATENT DOCUMENTS

| | | | |
|---|---|---|---|
| 5,656,963 | 8/1997 | Masleid et al. | 327/297 |
| 6,006,025 | * 12/1999 | Cook et al. | 395/500.15 |

OTHER PUBLICATIONS

C. L. Ratzlaff et al., "RICE: Rapid Interconnect Circuit Evaluation Using AWE," IEEE Transactions on Computer–Aided Design of Integrated Circuits and Systems, vol. 13, No. 6, Jun. 1994, pp. 763–776.

P. J. Restle et al., "Measurement and Modeling of On–Chip Transmission Line Effects in a 400 MHz Microprocessor," IEEE Journal of Solid–State Circuits, vol. 33, No. 4, Apr. 1998, pp. 662–665.

* cited by examiner

*Primary Examiner*—Tod R. Swann
*Assistant Examiner*—Hugh Jones
(74) *Attorney, Agent, or Firm*—Kevin M. Jordan; Wayne L. Ellenbogen (57) ABSTRACT

An X-Y grid tree clock distribution network for distributing a clock signal across a VLSI chip. Tunable wiring tree networks are combined with an X-Y grid vertically and horizontally connecting all the tree end points. No drivers are necessary at connection points of the tree end points to the X-Y grid. The final X-Y grid distributes the clock signal close to every place it is needed, and reduces skew across local regions. A tuning method allows buffering of the clock signal, while minimizing both nominal clock skew and clock uncertainty. The tuned tree networks provide low skew even with variations in clock load density and non-ideal buffer placement, while minimizing the number of buffers needed. The tuning method first represents a total capacitance of one or more of clock pin loads and twig wiring as a clustered grid load. Next, a smoothing of the clustered grid loads approximates the effect of the X-Y grid. Electrical simulation models are created for network components and clustered grid loads are substituted with smoothed clustered grid loads. A set of $N_{SECTOR}$ electrical net lists are next created by extracting a net list with associated X-Y grid wires cut to isolate each sector net list from its neighboring sectors. Each $N_{SECTOR}$ electrical net list is then tuned, wherein the smoothed clustered grid loads represent an approximation of the effects of the neighboring sectors of each $N_{SECTOR}$ electrical net list.

18 Claims, 12 Drawing Sheets

Twig Wiring and Pin Loads

Tuning Process

Tuning Process

X-Y GRID TREE TUNING METHOD

CROSS-REFERENCE TO RELATED APPLICATIONS

The present invention is related to co-pending U.S. patent application Ser. No. 09/022,141, entitled "X-Y Grid Tree Clock Distribution Network with Tunable Tree and Grid Networks," by Restle et al., filed of even date herewith. This co-pending application and the present invention are commonly assigned to the International Business Machines Corporation, Armonk, N.Y. This co-pending application is hereby incorporated by reference in its entirety into the present application.

FIELD OF THE INVENTION

The present invention relates to a system and method for distributing a clock signal across a VLSI chip, and particularly to a system and method for providing an easily implemented, tunable clock skew distribution with low nominal skew and low clock uncertainty.

BACKGROUND

Large high-performance very large scale integration (VLSI) chips have an internal clock signal that is a function of an external clock signal. This internal clock signal must be distributed to a large number of clock pins, which are specific locations or metal shapes on the chip, each of which has a known or estimated effective pin capacitance. The frequency of the clock signal determines the frequency and cycle time of the chip. Shorter cycle times result in higher chip frequency and improved chip performance. Clock skew can limit achievable cycle time, reducing chip performance. Clock skew within a chip is the difference in time that the internal clock signal reaches various parts of the chip. Specifically, the phrase clock skew as referred to herein, is the total maximum difference in clock arrival times between any pair of the clock pins. Clock skew can also refer to a subset of clock pins, where it refers to the maximum difference in arrival times between pins in that subset. Clock skew can further be separated into two components: 1) Nominal clock skew is the expected, difference in clock signal arrival times obtained from modeling and simulation; 2) Clock uncertainty refers to the unknown and random differences in clock signal arrival times. Since clock uncertainty is random and uncertain, statistical methods are used to predict total clock skew from the nominal clock skew and the clock uncertainty. The phrase local clock skew, refers to the clock skew between any small subset of nearby clock pins within a small area, where the area is a small fraction of the total chip size.

The nominal clock skew, if known early enough in the chip design process, can be taken into account in the chip circuit design, and does not necessarily increase cycle time. However, if this nominal skew changes significantly during the design process, it will usually cause an increase in cycle time. In addition, large nominal skew usually results in larger clock uncertainty, and clock uncertainty virtually always results in increased cycle time. Significant local clock skew is considered especially detrimental, especially if it is largely due to random clock uncertainty. This is because large local clock skew is more likely to cause functional errors in the chip outputs even at low clock frequencies, rendering the chip worthless.

The main contributors to nominal clock skew are: localized capacitance loading or capacitance load density variations across the chip; wire length differences causing differences in wire signal transmission times; and known wire environmental variations due to wires near the clock wires causing differences in clock wire capacitance or inductance.

The main contributors to clock uncertainty skew are: errors or uncertainties in wire transmission-line simulation models; uncontrolled variations in transistor parameters; uncontrolled process variations in wire properties such as width, space to adjacent wires, wire thickness, and inter-level dielectric constants; unknown or incorrectly modeled wire environmental variations; power supply and temperature fluctuations; and capacitive or inductive noise coupling from other wires switching at similar times.

By way of overview, present techniques are based on either tree-based networks, grid-based networks, or specific combinations of trees and grids. Tree-based networks control clock skew by relying on balanced routing methods that attempt to match wiring delays by equalizing wire lengths and loads, and sometimes by tuning wire widths to reduce nominal skew and/or uncertainty skew. This balanced routing can be difficult due to competition for chip wires in certain regions, especially when variable width wires are used. This balanced routing must also change every time any clock pins move or pin capacitances change significantly due to design changes. This makes it difficult to complete other chip wiring jobs until the final clock distribution wiring is complete. Tree based methods that match wire length by lengthening wires or matching effective pin capacitances by adding capacitance to small pin capacitances are relatively wasteful of wiring and power, since chip power increases with capacitance. Tree-based networks are susceptible to large local clock uncertainty, because a variation in any single wire property can cause significant local skew. It is also difficult to control wire transmission-line effects such as inductance and capacitance for complex tree networks, because it is difficult to route shields or transmission-line return paths adjacent to every clock wire in complicated balanced trees.

Grid-based networks control clock skew by wiring an X-Y grid of clock wires. This grid is then driven at a small number of places by large buffers, often at the edges and/or centerline of mesh. This results in very small local skew because the mesh is well connected within any local region. Unfortunately, this method uses a large amount of wiring tracks and wiring capacitance to achieve low skew. In addition, the nominal skew across the chip can be large, because the regions of the chip near the buffers receive the clock signal before the regions of the mesh far from the buffers. Also, simulation and tuning of grid-based networks is difficult because of the large number of interconnected wires and loads, resulting in a large amount of time and computer resources for a single accurate simulation, making tuning slower and more difficult.

Figure 1A:
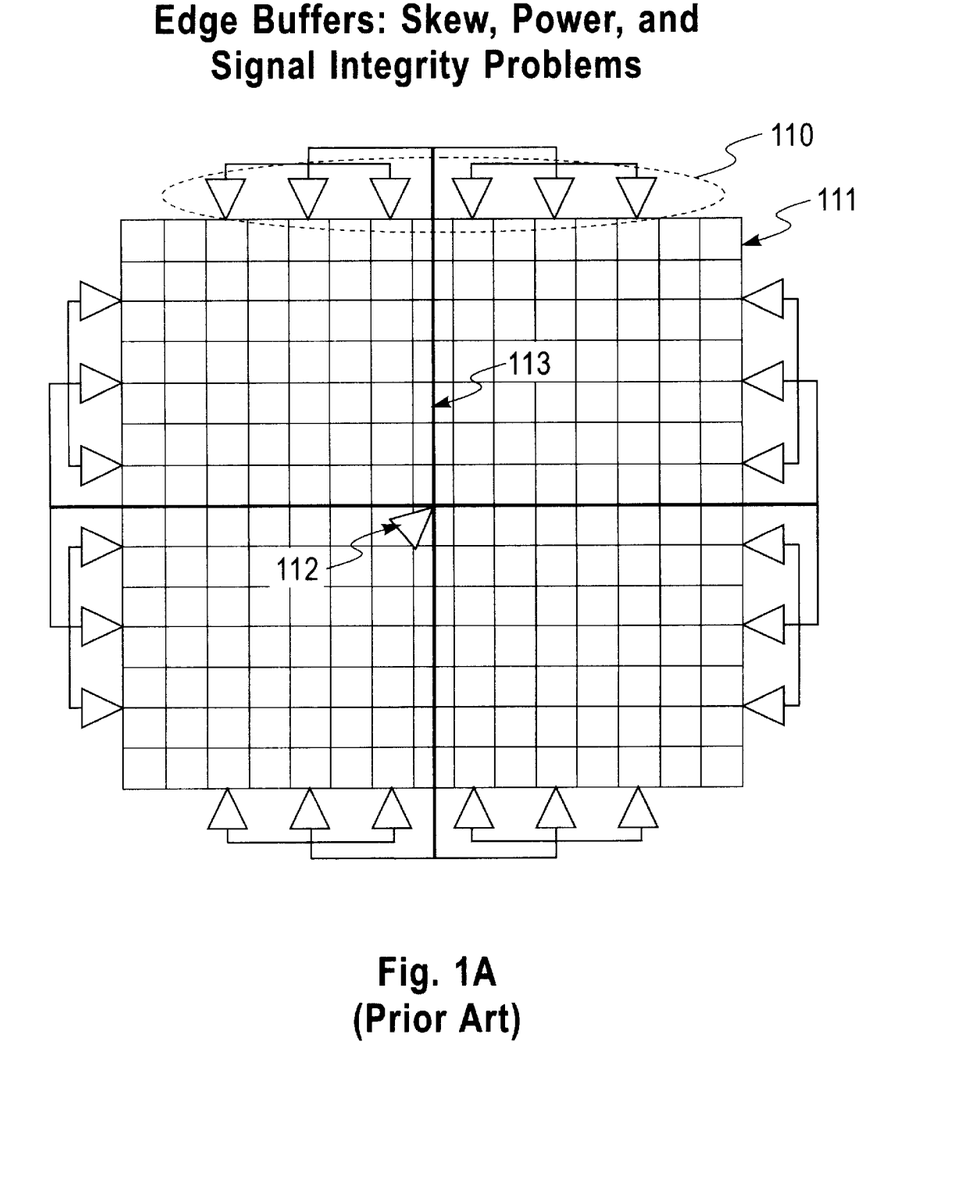
FIG. 1A depicts a prior art treelike network driving lines of buffers at every edge of an X-Y grid network.

FIG. 1A depicts an example of a network where a central re-powering buffer [112] receives the clock signal and distributes it using a treelike network [113] to lines of buffers at the 4 edges of the figure. These lines of buffers [110] drive all four edges of an X-Y wiring grid network [111]. This network reduces local skew significantly, but has significant skew due to the center of the grid receiving the clock signal later than the edges of the grid. There are also signal integrity problems with the signal wave-form at the center of the chip significantly different than that at the edges, resulting in additional effective skew in the circuits receiving these differing wave-forms. The large number of wide grid wires needed to reduce skew results in more wire capacitance and higher chip power.

Figure 1B:
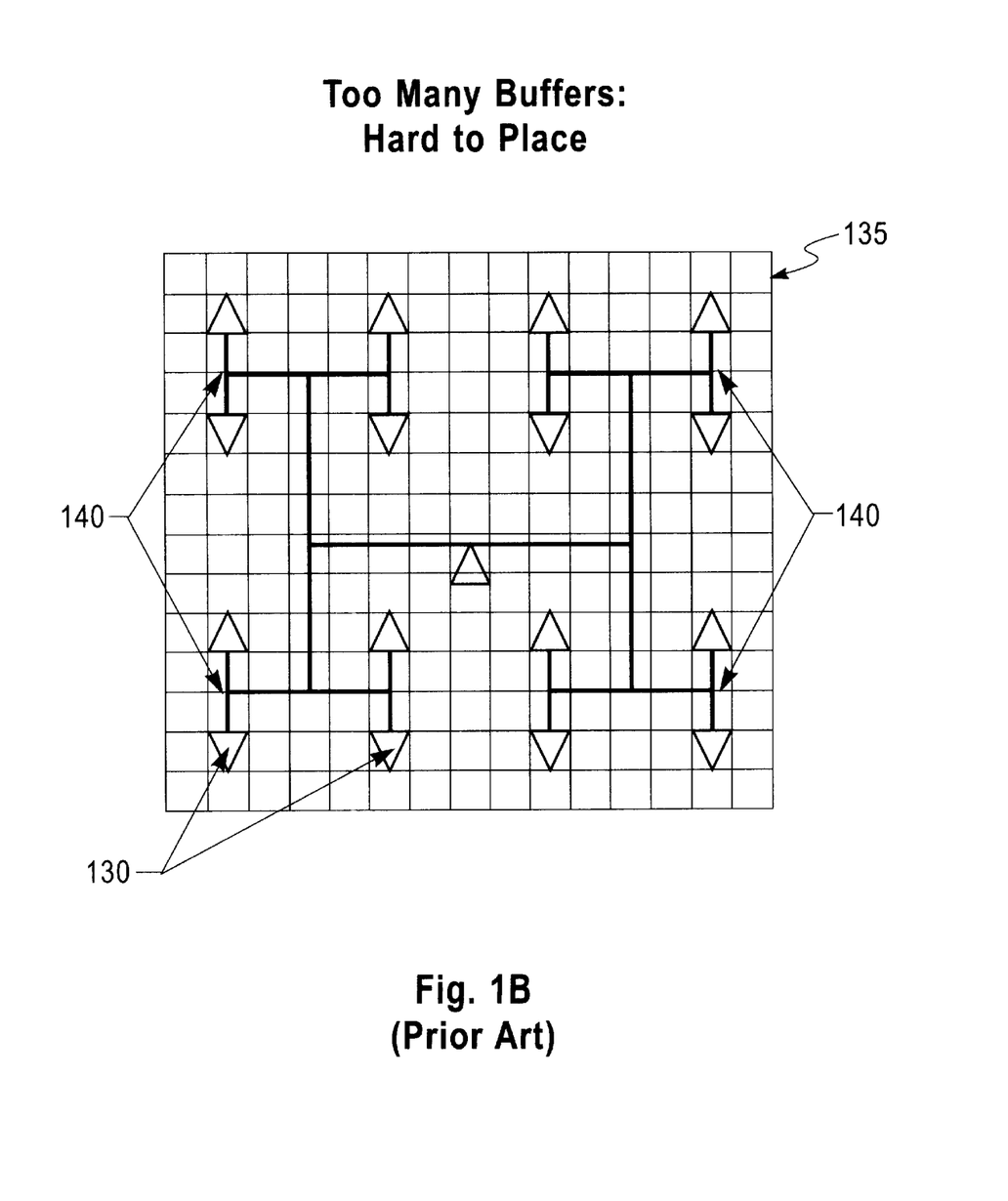
FIG. 1B depicts an example of a prior art grid tree with a large number of buffers.

FIG. 1B depicts an example of a X-Y grid tree with multiple levels of H-trees [140] and buffers to drive the grid [135] at more points to reduce the skew. However, to implement this network it is necessary to place the final buffers [130] at a large number of locations on the chip internal to the grid, which is inconvenient and often is impractical due to large design blocks such as memory arrays and data-flow blocks that cannot easily accommodate internal placement of clock buffers. See for example, U.S. Pat. No. 5,656,963, issued Aug. 12, 1997, entitled "Clock Distribution Network for Reducing Clock Skew," by Masleid et al., ["Masleid"], which uses symmetric H-trees driving a large number of buffers, which then drive an X-Y grid directly at a large number of locations. This requires a large number of buffer locations to minimize skew on the grid that occurs between buffers, and it is often impossible to find places on the chip for these buffers due blockages from large circuits such as memory blocks or data-flow circuits. Conversely, if the number of buffers driving the grid directly is reduced, the transmission time through the grid wires causes late clock arrival times at the points farthest from the buffers.

Accordingly, there is a need for a system and method for reducing the clock skew in a clock distribution method, including nominal skew and clock uncertainty skew (including both local clock skew as well as total clock skew), without using large amounts of wire or large numbers of clock buffers. There is a need for the system and method to allow flexible buffer and wire placement around blockages, and simple wire routing with easily designed shields to provide capacitive shielding and transmission-line return paths. The placement of most wires and buffers needs to be determined early in the design process, but the network should be adaptable to provide low skew even when clock buffer locations, clock pin locations, and pin capacitances change significantly during the design process. The present invention addresses these needs.

SUMMARY

In accordance with the aforementioned needs, the present invention is directed to a method for tuning an X-Y grid tree network transmission line properties and/or re-power buffers to reduce total clock distribution delay, uncertainty, and transition time. An example of a method for tuning the network includes the steps of: clustering a total capacitance of one or more of pins and wiring as a clustered grid load; smoothing clustered grid loads to approximate the effect of the X-Y grid; creating electrical simulation models for network components and substituting clustered grid loads with smoothed clustered grid loads; creating a set of $N_{SECTOR}$ electrical net lists by extracting a net list with associated X-Y grid wires cut to isolate each sector net list from neighboring sectors; and tuning each electrical net list as a function of the smoothed clustered grid loads to reduce one or more of power; wiring; and skew; wherein the smoothed clustered grid loads represent an approximation of the effects of the neighboring sectors of each $N_{SECTOR}$ electrical net list.

DETAILED DESCRIPTION

Figure 2:
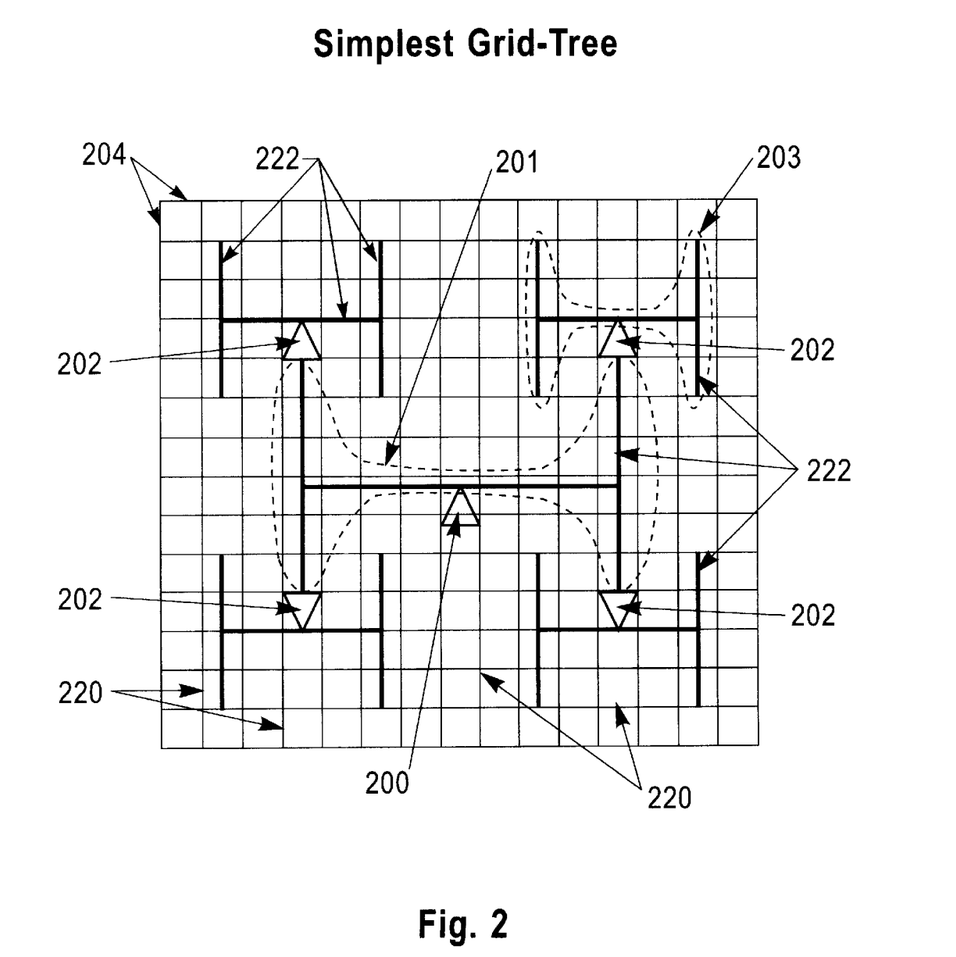
FIG. 2 depicts a simple embodiment of the clock distribution network of the present invention.

FIG. 2 depicts an example of a Grid-Tree network having features of the present invention in one of its simplest embodiments. As depicted, a buffer [200] receives and re-powers a clock signal, preferably near the center of the network. A first level tree wiring network [201] distributes this clock signal to a second level of re-powering buffers [202] (4 are shown). In the example shown, this is also the final level of re-powering buffers. Then a second level (and in this example the final level) of tree wires [203] (one for each of the final re-powering buffers [202]) distributes the clock signal to a number of points on an X-Y grid [204]. One advantage over the prior art network depicted in FIG. 1B is the reduction in the number of buffers that need to be placed on the chip, i.e. there are no buffers required at the connection points of the tree to the grid. One potential disadvantage is that non-uniform capacitive load densities connected to the grid could cause differences in the transmission time through the final trees. As will be described below and with reference to FIG. 7, the present invention includes features for reducing this skew by a tuning method.

Figure 3:
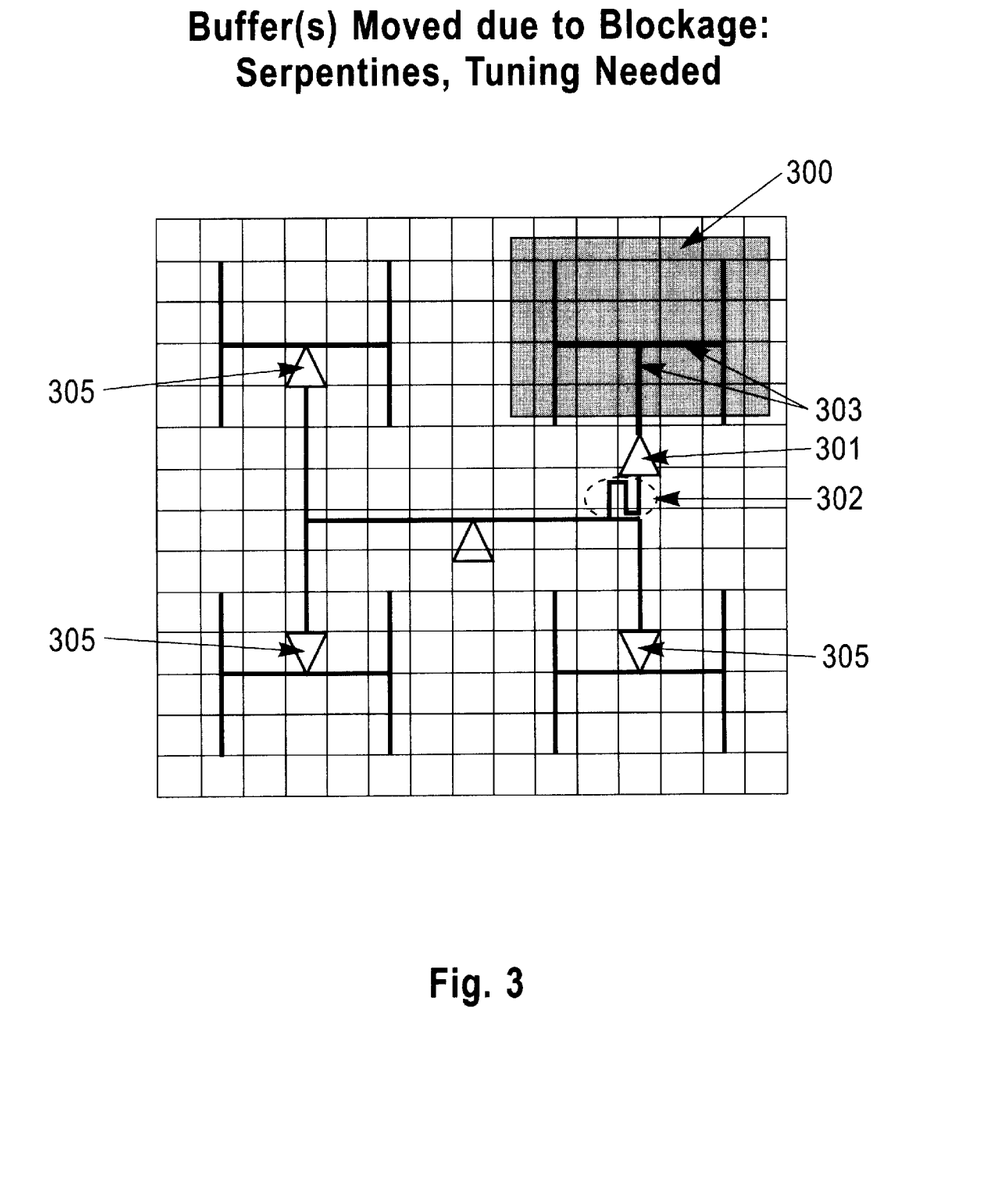
FIG. 3 depicts a block diagram depicting an example of how the invention adapts to blockages on the transistor or wiring levels.

FIG. 3 depicts an example of how the network of FIG. 2 adapts to a blockage [300] on the transistor design levels. An example of a typical blockage is a large array of densely packed memory cells leaving no space for the placement of a re-powering buffer [305]. According to the present invention, buffers [301] or wires can be moved to accommodate such blockages on transistor levels or wiring levels. Wire length matching [302] can be used where desired to equalize delays, and wire width tuning [303] can be used to reduce the skew due to the modifications needed to avoid blockages, as described below.

Although not shown in the figures, the grid wires also need not be completely regular. Individual grid segments or groups can be moved or removed as desired to avoid blockages or for other reasons. Methods to perform the tuning method when such modifications are present are described below.

Figure 4:
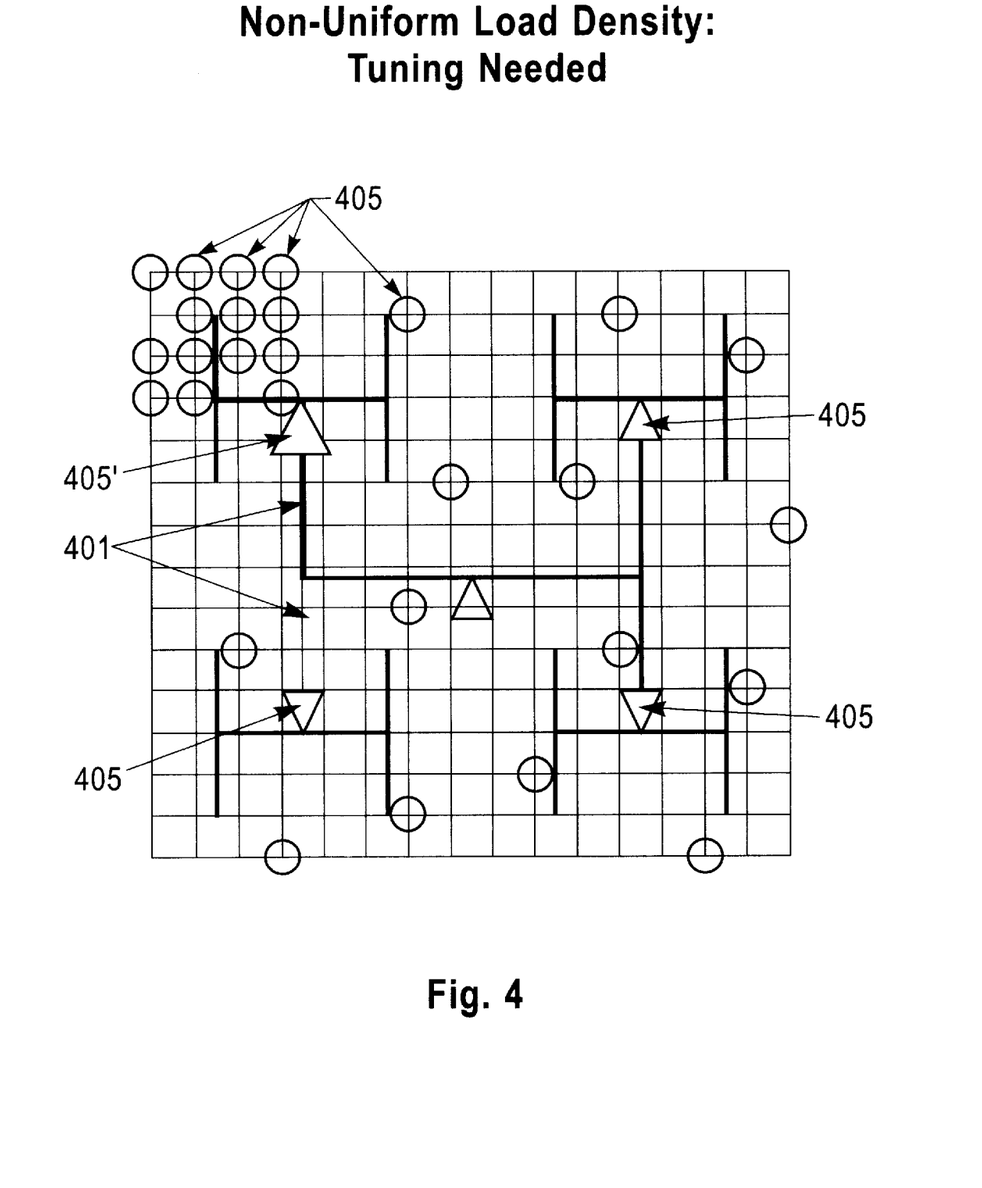
FIG. 4 depicts a block diagram depicting an example of how the invention adapts to non-uniform capacitance loading.

FIG. 4 depicts an example of how the network of FIG. 2 adapts to load density variations. As depicted, there are a large number of clock pins [400] connected to the grid in the upper left hand corner. Wire tuning using the tuning method [401] is used to reduce skew, as shown by the wider wires in the trees in the upper left quadrant of the diagram used to drive the larger number of load capacitances. In addition, the re-powering buffers [405] can be tuned [405'], and the tree network or networks driving the final buffers can also be tuned.

The network in FIG. 2 can be modified by adding a coarser grid connecting points at earlier levels of the tree distribution. For example (not shown), a rectangle of wiring could be used to connect the 4 inputs (or outputs) of the sector buffers [202] potentially resulting in lower clock uncertainty.

On-chip clock wiring networks are known to exhibit significant transmission line electrical properties, See for example, "Measurement and Modeling of On-Chip Transmission Line Effects in a 400 MHz Microprocessor" by Restle et. al., ["Restle"], IEEE Jour. of Solid-State Circuits, Vol. 33, No. 4, pp. 662–665, April 1998.

To improve control of transmission line properties, any or all of the wires in the clock networks described herein may represent multiple closely spaced parallel wires composed of signal wires interposed with power or ground wires or both. For example, any of the grid wires [220] or tree wires [222] depicted in FIG. 2 (only a subset referenced for clarity) could include signal wires interposed with power or ground wires or both. Such wire cross-sections are examples of coplanar transmission lines, and are useful for the reduction of inductance and for improved control of other transmission line properties such as: effective resistance and reducing sensitivity of wire electrical properties to process variations; and wiring densities on adjacent wiring layers. Such wiring cross-sections containing more than one clock signal wire will be referred to herein as "fingered transmission lines".

If fingered transmission lines are used, the wire tuning process must include a method for tuning these more complicated structures. This is done by adjusting the power and ground wire widths and placement simultaneously with the signal wire widths. As a simple example, when the width of a particular clock signal wire finger is narrowed by 1.0 micron, the widths of the power or ground wires on both sided of this signal wire can be widened by 0.5 microns each, so that the spaces to adjacent wires remains constant as the signal wire width is tuned.

To facilitate the tuning process, equivalent-circuit elements that capture high frequency electrical behavior are stored in the tables for processing. These elements are derived from three-dimensional transmission-line modeling. The tables and derivation of constant-parameter equivalent-circuit approach greatly simplifies simulation complexity and run time. See for example commonly assigned, co-pending U.S. patent application Ser. No. 09/140,643, by A. Deutsch, H. Smith, G. V. Kopcsay, A. H. Dansky, and P. J. Restle, "System and Method for Reducing Calculation Complexity of Lossy, Frequency-Dependent Transmission-Line Computation", IBM, filed Aug. 26, 1998. This patent application is hereby incorporated by reference herein in its entirety into the present application.

In previous work involving large grids, it was found to be difficult to tune these networks due to the large number of interconnected wiring components. This is due to the fact that a change in the design properties of any individual wire or buffer changes the clock arrival time and wave-form for every point in the network. Since actual clock networks involving X-Y grids can consist of more than 10,000 interconnected wire segments, a single transient simulation of the entire network to calculate skew can take approximately an hour. Reducing the skew through wire and buffer tuning requires the tuning of typically thousands of wires and on the order of 100 buffers. In addition, due to the complicated network containing many circuit loops, the accuracy needed, and the presence of significant transmission line effects, simple approximation methods such as Elmore delay estimates that can speed up simulation or tuning are not applicable. These problems resulted in unacceptable accuracy or computer time when tuning was attempted with previous techniques.

Accordingly, the design, tuning, and re-tuning methods of the present invention that solve these problems will now be described with reference to FIGS. 5–8. Note that early in the design and tuning process only rough estimates of capacitive load densities on the chip are needed.

Figure 7:
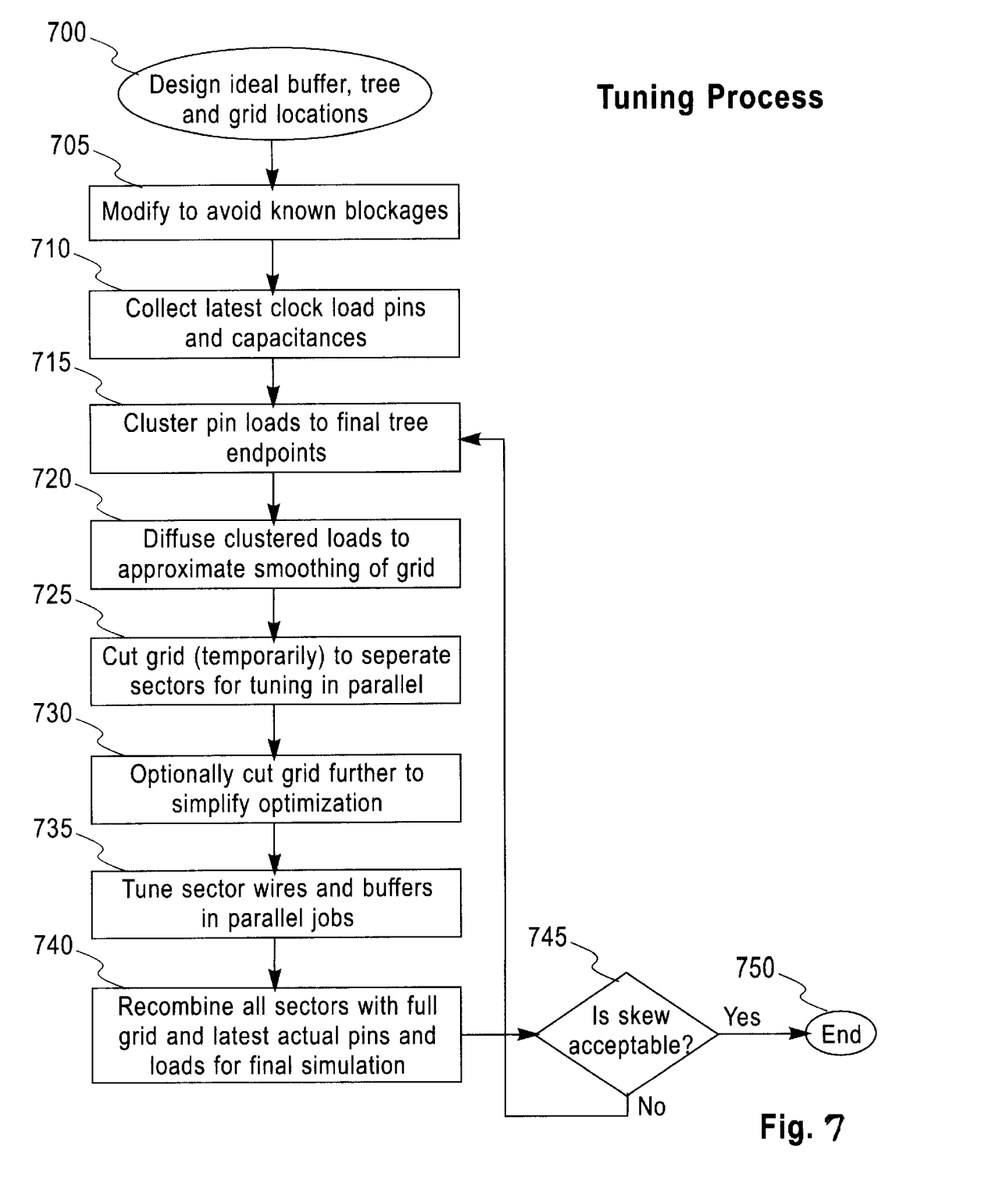
FIG. 7 depicts an example of a flow diagram of the tuning method.

By way of overview, first an X-Y grid of wires is designed (see e.g., FIG. 2, [204] and FIG. 7, step 700). The grid should have enough wires in the X and Y direction to allow short wires with relatively negligible delay to be used to connect any clock pin to the grid (see the discussion of FIG. 7 below). Conversely, the number of X-Y grid wires should not be too large because an excessively large number of X-Y grid wires will increase wire capacitance, wiring congestion, and chip power. The width of the grid wires can be tuned, but may also be chosen to be a constant width for simplicity and to reduce model and process uncertainties. The spacing of the wires can be constant in both the X and Y directions or it can vary to avoid blockages or such that regions with higher clock load capacitance may have more wires.

Next, the number of final buffers $N_{SECTOR}$ is chosen (ideally a power of 2), and these buffers are distributed as uniformly as possible over the area covered by the X-Y grid. A larger number of buffers can provide faster transition times of the clock signal present on the mesh, but a large number of buffers is more difficult to place where desired on the chip. Then $N_{SECTOR}$ wiring trees are designed connecting the buffer outputs to the X-Y grid. Ideally these are symmetric or nearly symmetric H-trees or parts of H-trees. Instead of using a direct connection to the grid as in [Masleid], in this invention it preferably consists of one or more levels of wiring H-trees. As described above with reference to FIG. 1D and FIG. 2, more tree connections to the X-Y grid reduces skew by driving the grid more uniformly. If the tree network connects to the grid at an insufficient number of locations, the clock signal will arrive at those few locations earlier than places not connected to the final level of trees. This final tree network can consist of H trees as shown, or can consist of other forms of low skew tree networks, or combinations of trees and grids.

Next, transistor level or wiring blockages can be taken into account, by adjusting buffer placement, tree network wires, and X-Y grid wires to avoid known blockages (see e.g., FIG. 7, step 705 and FIG. 3.

Then an electrical net-list can be created by a conventional extraction process. Specifically, electrical simulation models of buffers and wiring can be created for every network component such as: transistors; wires; vias (a via is a conducting metal shape that connects different wiring levels); and clock pins, that are connected to the X-Y grid (FIG. 7, step 710). As is conventional, a transient simulation can be performed to evaluate the skew and waveforms on the X-Y grid. If the skew and waveforms are acceptable at this point, the design is complete and further tuning may not be needed. In general, however, the modifications needed to avoid blockages, as well as non-uniformities in the capacitance loads will result in unwanted levels of skew that can be reduced by the tuning method described below. The tuning method widens and/or narrows wire widths and/or fingered transmission line structures and adjusts buffer sizes to reduce skew and other undesirable clock network properties.

Figure 5:
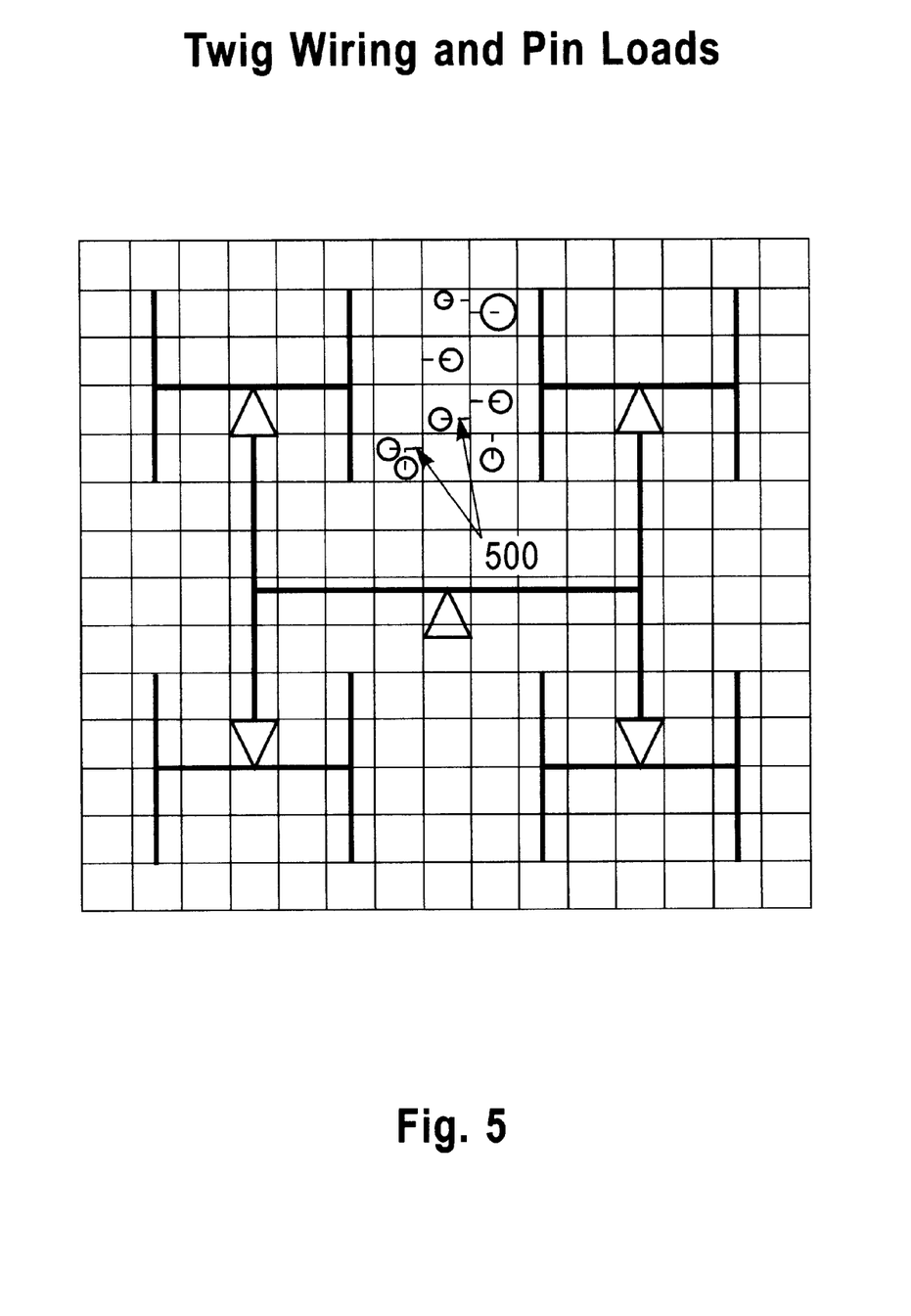
FIG. 5 depicts an example of twig wiring.

FIG. 5 depicts an example of the twig wiring [500] typically needed to supply the clock signal to clock pin locations not aligned with the grid wires. Twig wiring refers to the relatively short clock distribution wiring containing branching or non-branching wires from the X-Y grid wiring to the actual clock pin locations. Clock pin load capacitances are the effective capacitances that need to be driven at each clock pin. Larger capacitances are represented by larger circles in the figures.

It will be apparent to one skilled in the art, that the clock pins described above may represent the input pins of local clock generating circuits, which may create one or more buffered local clock signals based on the signal arriving at each clock pin described here.

Figure 6:
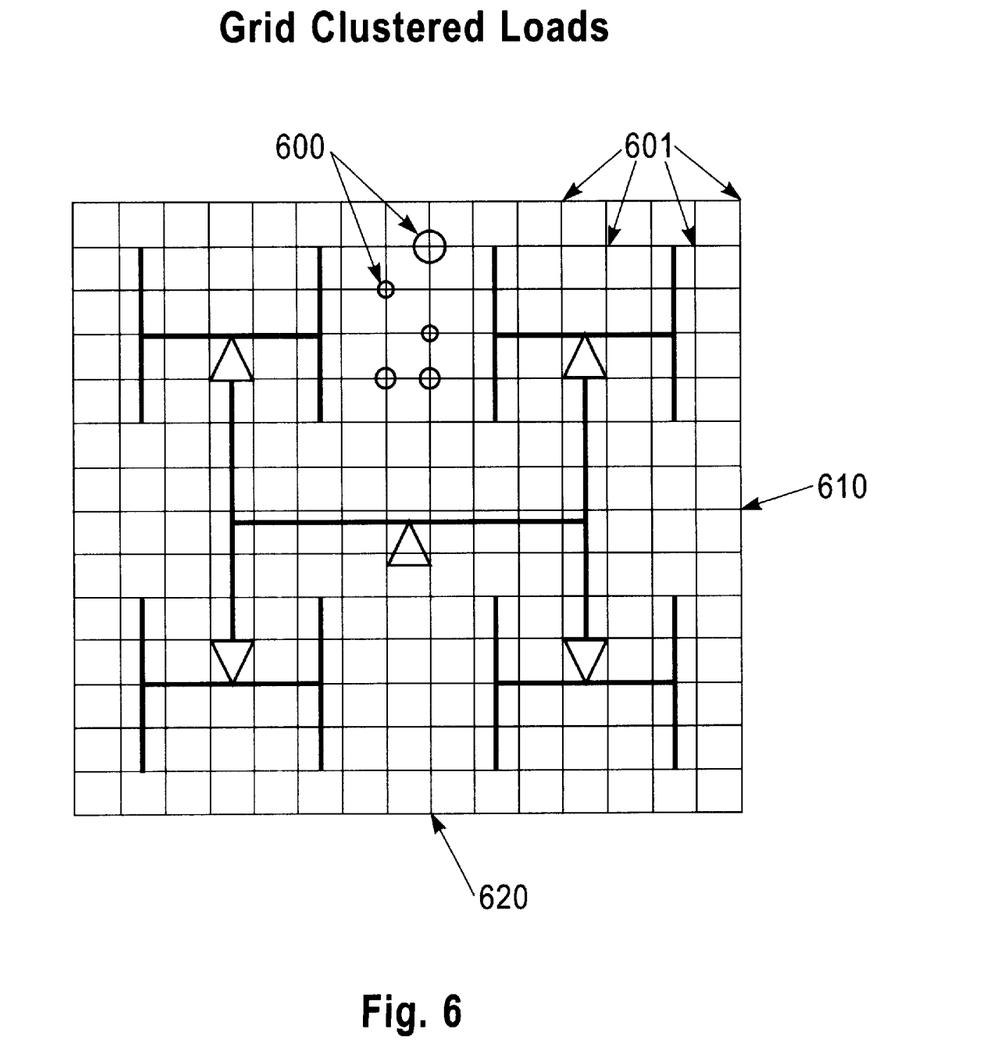
FIG. 6 depicts an example of grid clustered clock loads.

To perform the tuning method efficiently, all capacitance loads representing twig wiring are preferably removed and replaced by clustered grid loads [600] as shown in FIG. 6 (see also FIG. 7, step 715). Preferably, each clustered grid load represents the total capacitance of the clock pin loads and twig wiring that are nearest to the respective grid intersection point [601]. A grid intersection point is the intersection of an grid wire in the X direction [610] and a grid wire in the Y direction [620]. Those skilled in the art will appreciate that this clustering need not be to the nearest grid intersection point and that other clustering points can be selected.

Figure 8:
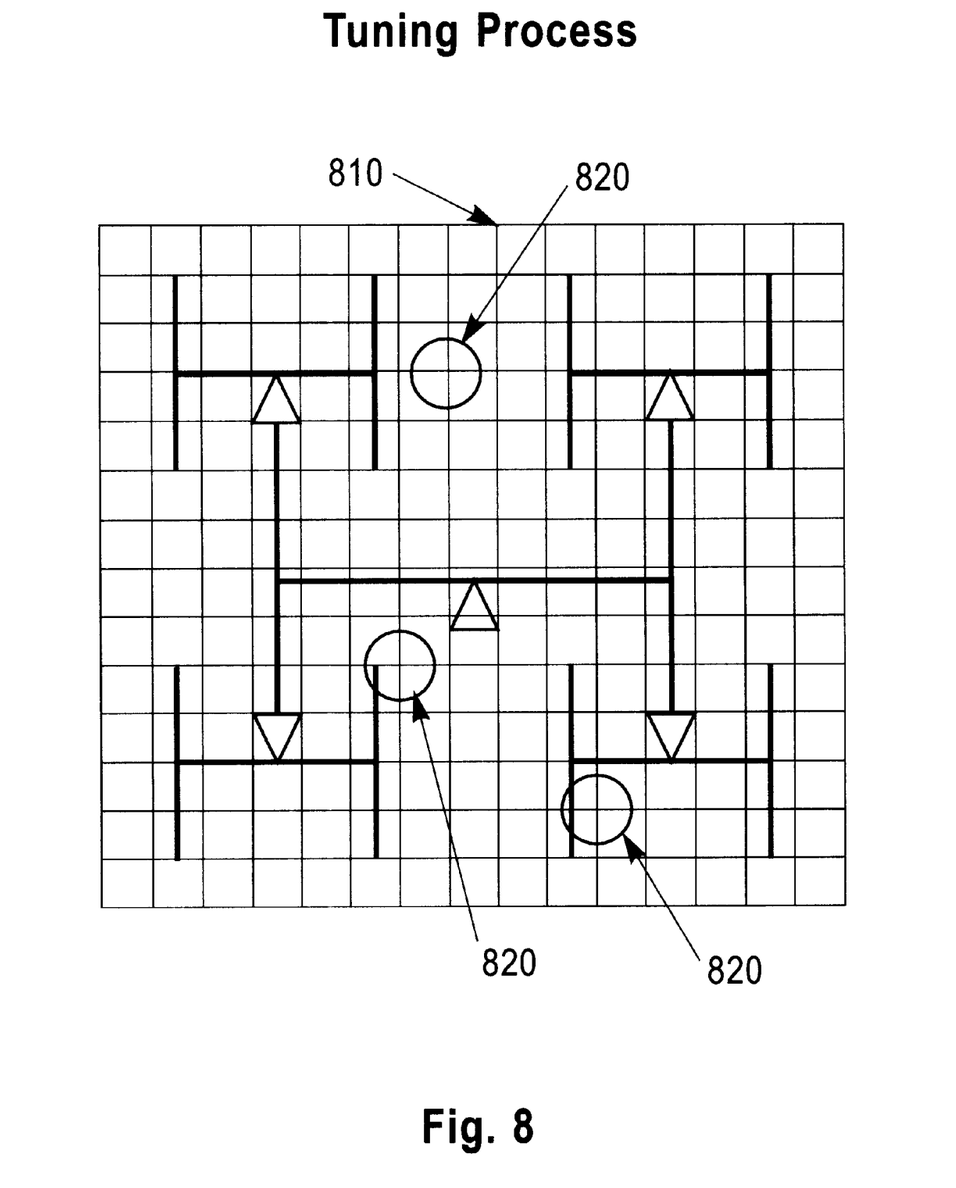
FIG. 8 depicts an example of an X-Y grid tree with clustered loads.

FIG. 8 depicts an example of a X-Y grid-tree [810] with 3 clustered loads [820]. A set of capacitances at all grid intersection points can be represented by a grid capacitance matrix as in the example depicted in Table I (below).

a smoothing method to create smoothed loads FIG. 7, step 720). A preferred embodiment of the smoothing method is to use a simple smoothing algorithm such as the classical mathematical method known as Jacobi's method. In its simplest form, the method consists of replacing each element of the matrix with a weighted average of the present value and the four nearest neighbor values. This averaging is done for every element of the grid capacitance matrix, for one iteration. Typically a small number of iterations from 1 to 20 are performed sequentially where more iterations produce more smoothing. The weights can be any constants that preserve total capacitance. Performing this process on the matrix of table I results in the smoothed grid capacitance matrix shown in Table II.

This smoothed grid capacitance matrix has a smoother distribution of clock loads, and in general has a smaller range of capacitances than the original grid capacitance matrix. Its purpose is to approximately represent the smoothing effect of the X-Y grid network for smoothing out the effects of load density variations. The weights used for nearest neighbor averaging of the Jacobi's method thus have a simple physical interpretation. For example if the X direction grid wires have twice the resistance of the Y direction grid wires, the weights used in the Jacobi's method for the nearest neighbors in the X direction should in general be half as large as the weights for nearest neighbors in the Y direction. If a particular grid wire is narrowed or deleted to avoid blockage or reduce wiring or power usage, the corresponding weight should be reduced. Similarly, the

TABLE I

| 0 | 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|---|
| 0 | 0 | 0 | 0 | 0 | 0 | 0 | 0 | 100 | 0 | 0 | 0 | 0 | 0 | 0 | 0 |
| 0 | 0 | 0 | 0 | 0 | 0 | 0 | 20 | 0 | 0 | 0 | 0 | 0 | 0 | 0 | 0 |
| 0 | 0 | 0 | 0 | 0 | 0 | 0 | 0 | 20 | 0 | 0 | 0 | 0 | 0 | 0 | 0 |
| 0 | 0 | 0 | 0 | 0 | 0 | 0 | 40 | 40 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |

The non-zero elements in Table I represent the clustered grid loads [600], so that each element of this matrix is the clustered load capacitance associated with one grid intersection. This grid capacitance matrix is then operated on by boundary conditions at the mesh edges can be easily handled. At this point the grid clustered loads are temporarily replaced with the smoothed loads in the net lists used for tuning described below.

TABLE II

| 0 | 0 | 0 | 0 | 0 | 0 | 0 | 0 | 20 | 0 | 0 | 0 | 0 | 0 | 0 | 0 |
|---|---|---|---|---|---|---|---|---|---|---|---|---|---|---|---|
| 0 | 0 | 0 | 0 | 0 | 0 | 0 | 4 | 20 | 20 | 0 | 0 | 0 | 0 | 0 | 0 |
| 0 | 0 | 0 | 0 | 0 | 0 | 4 | 4 | 28 | 0 | 0 | 0 | 0 | 0 | 0 | 0 |
| 0 | 0 | 0 | 0 | 0 | 0 | 0 | 8 | 4 | 4 | 0 | 0 | 0 | 0 | 0 | 0 |
| 0 | 0 | 0 | 0 | 0 | 8 | 16 | 20 | 8 | 0 | 0 | 0 | 0 | 0 | 0 | 0 |
| 0 | 0 | 0 | 0 | 0 | 0 | 8 | 8 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |

Figure 10:
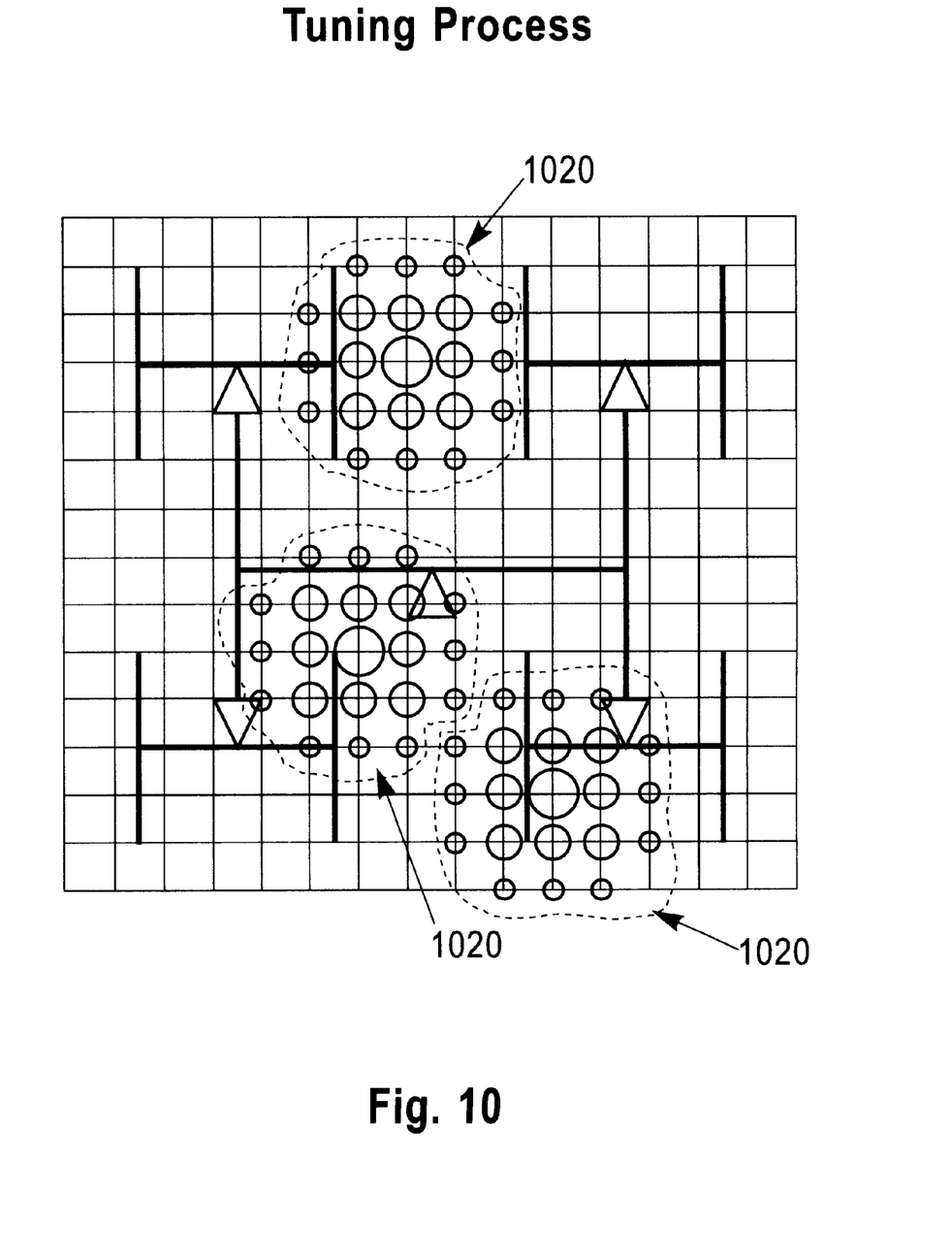
FIG. 10 depicts an example of an X-Y grid tree with smoothed loads.

This smoothing process is also represented in the logic flow of FIG. 7, step 720 and graphically for the X-Y grid-tree (unsmoothed loads, 820) in FIG. 8, in the block diagram of FIG. 10 (where the clusters of loads [1020] represent a smoothing of the loads [820], where the effect of the load is proportional to the size of each circle in the clusters [1020]).

Figure 9:
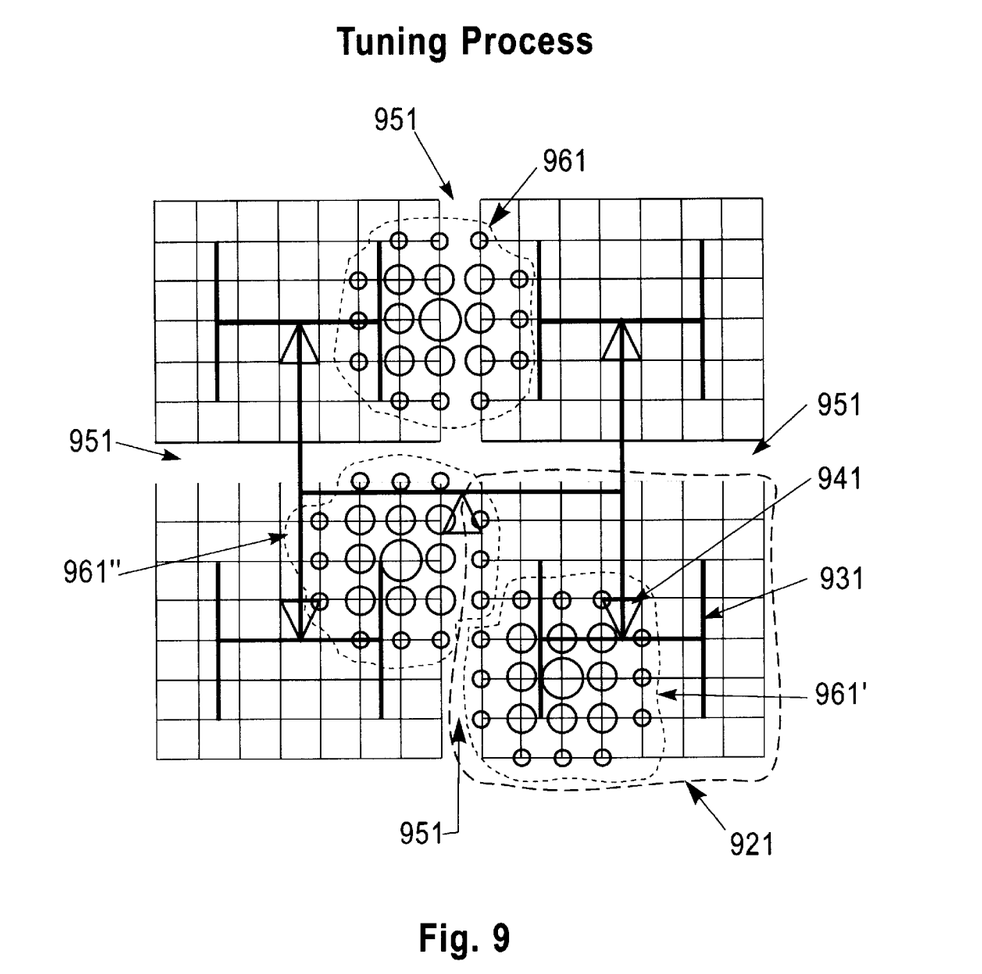
FIG. 9 depicts an example of an X-Y grid tree with smoothed loads and cut sectors.

Referring now to FIG. 7, step 725, with reference to FIGS. 9–10, for purposes of tuning, preferably a set of one or more $N_{SECTOR}$ electrical net lists are then created (e.g., from the net lists corresponding to the network depicted in FIG. 10), called isolated sector net lists (FIG. 9, [921]). Each isolated sector net list represents one sector tree and the section of the grid most closely connected to that tree. A sector tree [931] is the tree network driven by the respective sector buffer [941]. The isolated sector net lists are created by extracting a net list with the X-Y grid wires cut [951] so as to isolate each sector tree from its neighboring sectors. This effectively separates the tuning problem into $N_{SECTOR}$ smaller tuning problems. The smoothing method represents the electrical effects of the X-Y grid. This smoothing allows a large load in one sector to be felt in neighboring sectors. The smoothing method allows an approximate representation of the effects of neighboring sectors, even though each sector is tuned separately, and thus allows efficient yet accurate tuning of very large clock distribution networks including grids.

Optionally, in FIG. 7, 730, a cut-loop sector net list, can be created, where the grid wires within each sector [931] can be further cut (not shown graphically) to create a sector net list with no wiring loops. Net lists with fewer or no loops can result in faster or more accurate simulation or tuning, and can be easier to tune for low skew in the buffer and wire tuning process.

One method for choosing or evaluating a potential grid capacitance smoothing method, (for example to determine how many iterations of Jacobi's method to perform) is to take the original ideal electrical network containing identical symmetric trees in all sectors and the full X-Y grid, but with the grid capacitances replaced by a perfectly uniform grid of identical capacitances having the same total capacitance as the true grid capacitance. When simulated, this network should have zero skew or very low skew. Then, increase the value of one matrix element representing a grid intersection point near the center of the X-Y grid by a multiplicative factor of 10 to create a point-load grid capacitance matrix. This network with the point-load grid capacitances is then simulated. The signal arrival times at every grid intersection point are calculated and placed in a true point-load response matrix. Then the grid capacitance smoothing function is applied to the point-load grid capacitance matrix. The resulting smoothed point-load grid matrix is then used as the loads for a net list consisting of all cut-loop sector net lists. When this net list is simulated, the clock signal arrival times at every grid intersection point can again be calculated and placed in a smoothed point-load response matrix. If the smoothing method is accurate, both the true point-load response matrix and the smoothed point-load response matrix will be similar, having similar skew peaks and similar half-widths in both the X and Y directions.

Once each cut-loop sector net list is combined with the smoothed load grid capacitance matrix elements corresponding to that sector are created, the buffer and wires within each sector can be tuned. As referenced in FIG. 7, step 735, since there are no connections between these sector net lists, the tuning can be done in parallel, for example on multiple computers, for reduced program run time.

This tuning method can be applied to other grid based clock distribution methods. For example, the network in FIG. 1A can be cut into separated sector net lists driven by each buffer if the cutting method used to isolate sector networks includes the cutting of vias as well as wiring (not shown in figures). One skilled in the art will be able to apply this tuning method to a variety of grid based clock distribution networks with minor adjustments of the network and grid cutting and clock load smoothing methods.

The buffer and wire tuning of each sector network requires electrical transmission line models of the wires as a function of wire width, including, for example parameters such as the space to adjacent wires on the same level, the fraction of wiring tracks used on orthogonal wiring levels, the distance to and width of nearby inductive return paths, etc.. Lookup tables combined with interpolation, and approximate analytic functions may be used to estimate and speed up the calculation of these transmission-line electrical properties.

A scalar objective function is then chosen such that the minimization of this objective function results in an optimized design point. See for example co-pending, commonly assigned patent application Ser. No. 08/934,995, by Cook et al., filed Sep. 22, 1997 entitled "A Method of Clock Routing for Semiconductor Chips," which is hereby incorporated by reference in its entirety. Typically there are several competing design objectives, in which case the objective function consists of a weighted sum of several terms. In the preferred embodiment the objective function is a weighted sum of the R. M. S. skew error and the R. M. S. Transition time error and the total capacitance. The R. M. S. skew error is the root-mean-square of the difference between each clock arrival time and the desired clock signal arrival time at every clustered grid load. The R. M. S. transition time error is the root-mean-square of the difference between each clock transition time and the desired clock transition time at every grid intersection point. The total capacitance is the sum of all wiring capacitance and buffer parasitic capacitance, which is proportional to the chip power used. The weights of these terms are chosen to reflect design tradeoffs such as the tradeoff between skew and chip power. For example, reducing the weight of the capacitance term in the objective function will in general result in a network with lower skew, but in general higher power. Another potential term in the objective function could include the calculated skew expected for a a different process corner such as a wire-width bias or an environmental condition such as temperature. In this way the tuning process can be used not only to reduce skew but create a more robust and reliable clock distribution network with smaller clock uncertainties.

The independent tunable parameters of the objective function include the tree wire widths and adjacent wire or shield spacing, and the sector buffer strength or device sizes. The width and location of shield wires and inductive return paths are other potential independent parameters.

This objective function along with the tunable parameters and their allowable ranges can then be used with any nonlinear optimization algorithm. In the preferred embodiment a gradient based nonlinear optimization method that allows for simple bounds for the tunable parameters is sufficient.

To calculate the value of the objective function for any valid set of input parameters, a fast simulation method or some approximation is needed. In the preferred embodiment a reduced order model method such as an AWE based (Asymptotic Wave-form Estimation) is used to quickly calculate the delays and optionally transition times needed to calculate the objective function. For example, a reduced order interconnect modeling technique such as RICE can be used to speed the calculation of delays, transition times, and sensitivities in the optimization process (see, for example, C. L. Ratzlaff and L. Pillage, "RICE: Rapid Interconnect Circuit Evaluation Using AWE" IEEE Transactions on Computer-Aided Design of Integrated Circuits and Systems, Vol. 13, No. 6. pp. 763–776, June, 1994).

To further speed the simulations used needed during the tuning process, the electrical models representing the cut grid wires (but not the tree wires) can be simplified and reduced to lumped capacitances placed at the grid intersection points.

The result of the objective function optimization should be optimal values of every adjustable parameter, for example the optimal width of every tunable wire, and the size of every device in each sector buffers.

Figure 11:
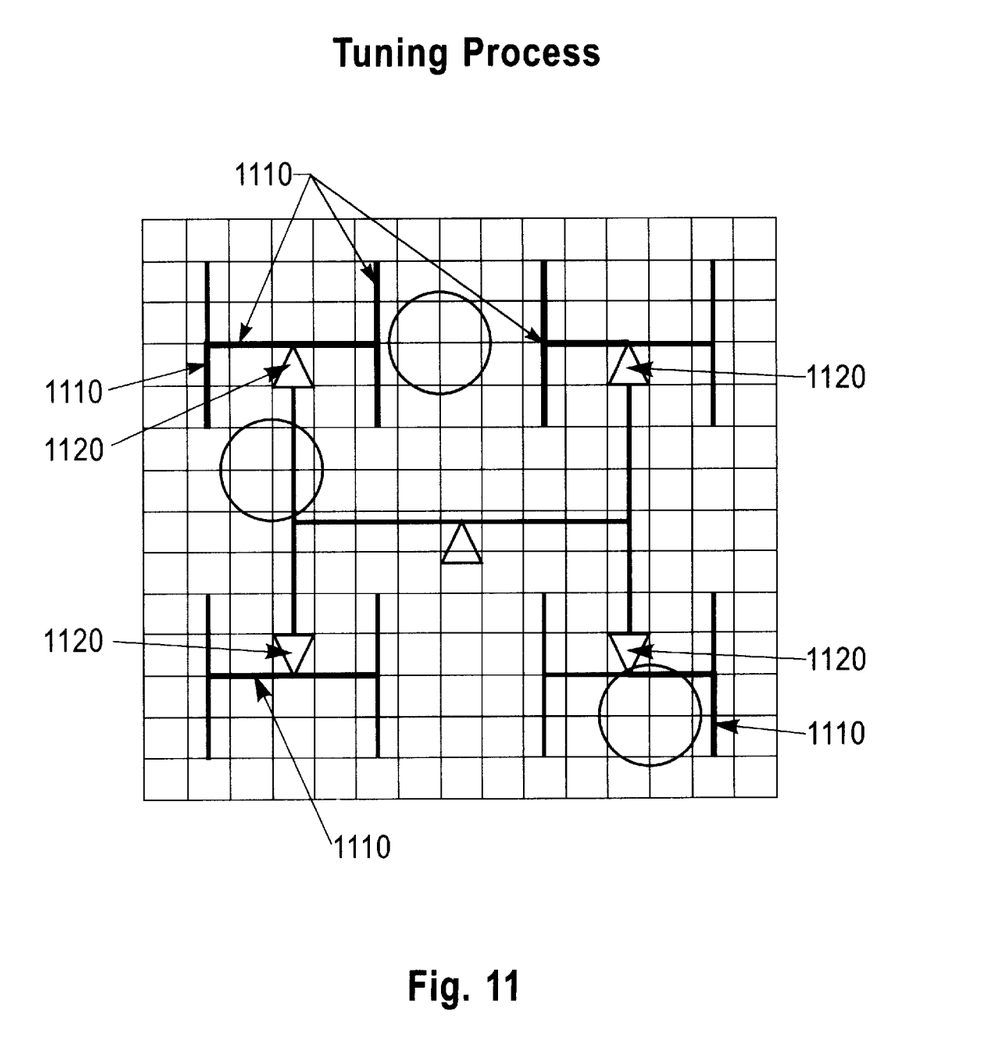
FIG. 11 depicts an example of an X-Y grid tree with tuned wires and buffers.

As depicted in FIG. 11, once the tuning method has produced optimized wire widths and buffer sizes, a tuned net-list containing these tuned wires [1110] and buffers [1120] is created and simulated.

The simulations done during the optimization process thus contain a number of approximations:
1) the actual twig wires and load are represented by clustered grid loads;
2) the load smoothing effect of the X-Y grid wires is represented by the grid capacitance smoothing method;
3) the optionally cut-loop sector networks with smoothed grid capacitances only approximately represents the true network of interconnected trees, buffers, and the X-Y grid network;
4) a fast, approximate simulation method may be used.

As referenced in FIG. 7, step 740, it is thus advisable to perform a final full-accuracy extraction and simulation of the actual tuned network with these approximations removed. This is accomplished by implementing the optimum wiring and device sizes in a design with the fill uncut X-Y grid wiring in place (e.g., as graphically depicted in FIG. 11), preferably including all twig wires and pin loads (FIG. 5), extracting this design to create a full electrical net list, and performing an accurate transient simulation with a high accuracy nonlinear circuit simulation method such as SPICE, to evaluate the skew, power, and signal integrity of the tuned clock network with maximum accuracy. This final extraction and simulation may take significant time, but since it can be performed at the same time as other final checking processes, in practice the final extraction and full simulation of the clock distribution network does not add to the total chip design time.

As VLSI chip designs evolves, the clock loads, the twig wiring, and minor blockage avoidance modifications may change a number of times. In some cases, once the desired modifications have been made, either an approximate or final extraction and full simulation clock distribution network may show that re-tuning of the clock distribution is needed, (see FIG. 7, step [745]). If re-tuning is required, the process can be repeated by returning to step 715. This re-tuning can be facilitated if a clock distribution contract or abstract exists describing the maximum wire tracks and device area that may result from the tuning process. This contract then results in upper bounds on tunable parameters such wire sizes and spaces, or buffer sizes, and these limits result in boundary conditions for the nonlinear optimization program. To further reduce power and wiring used by the clock distribution network, the electrical current in each segment of the X-Y grid can be determined from the transient simulation of the full electrical net list. A method can be used to identify X-Y grid wire segments with small currents, which are thus relatively unnecessary, and a fraction of these unnecessary grid segments can be deleted, especially if there are no twig wires using such a grid wire segment, or the twig wiring can be easily modified to use another X-Y grid segment. This grid deletion step can then be treated like other design modifications described above such as blockage avoidance or clock pin load changes: grid segment deletions may require modification of the local twig wiring, final checking, and if warranted, re-tuning. Portions of some tree wiring levels may also be removed by a similar tree branch deletion method. In fact it may be obvious, for example, that one or more corners of the chip may contain no clock pins, or only pins with much greater tolerance for clock skew, in which case the low skew network trees and grid wires in that region could be deleted. These modifications should be reflected in the smoothing function boundary conditions or smoothing coefficients so that the smoothing function still accurately simulates the effect of the modified X-Y grid wires.

A clock distribution network and tuning method combining the characteristics of tunable wiring trees and an X-Y grid has been disclosed that significantly reduces skew in large high-speed VLSI circuits, while also reducing design time.

Now that the invention has been described by way of a preferred embodiment, with alternatives, various equivalents and modifications will be readily apparent to those skilled in the art and the generic principles herein may be applied to other embodiments. Thus, the present invention is not intended to be limited to the embodiment shown but is to be accorded the widest scope consistent with the appended claims consistent with the principles and features described herein.

What is claimed is:

1. A method for tuning a X-Y grid tree clock distribution network, the method comprising the steps of:
   clustering a total capacitance of one or more of pins and wiring as a clustered grid load;
   smoothing clustered grid loads to approximate the effect of the X-Y grid;
   creating electrical simulation models for network components and substituting clustered grid loads with smoothed clustered grid loads; and
   creating a set of $N_{SECTOR}$ electrical net lists by extracting a net list with associated X-Y grid wires cut to isolate each sector net list from neighboring sectors; and
   tuning each electrical net list as a function of the smoothed clustered grid loads to reduce one or more of power; wiring; and skew; wherein the smoothed clustered grid loads represent an approximation of the effects of the neighboring sectors of said each $N_{SECTOR}$ electrical net list.

2. The method of claim 1, wherein the clustered grid loads are represented in a grid capacitance matrix.

3. The method of claim 2, further comprising the step of smoothing the capacitance matrix using Jacobi's method to simulate a smoothing effect of the X-Y grid.

4. The method of claim 1, further comprising the step of providing a set of buffers to condition the signals between any two levels of branching trees.

5. The method of claim 1, further comprising the step of interconnecting all the clock signals between any two levels of branching trees using an X-Y grid.

6. The method of claim 1, further comprising the step of routing local clock distribution wiring using branching or non-branching wires from the X-Y grid to clock pin locations needing the clock signal.

7. The method of claim 2, further comprising the step of cutting of the X-Y grid of each sector net list to remove circuit loops.

8. The method of claim 3, wherein said representing step further comprises the step of clustering X-Y grid wire capacitances, to further reduce the number of electrical elements in the sector net lists.

9. The method of claim 1, further comprising the step of tuning one or more tunable network parameters using a nonlinear optimization method.

10. The method of claim 9, further comprising the step optionally using a reduced order interconnect modeling technique such as RICE to calculate one or more of delays, transition times, and sensitivities.

11. The method of claim 1, wherein one or more of the tree or grid wires are implemented as a set of parallel wires composed of alternating signal wires and power or ground wires, further comprising the step of tuning each set of said parallel wires as a group by varying each wire width and space to maintain transmission line properties.

12. The method of claim 1, further comprising the step of simulating a full net list for final full simulation and checking, the net list including tuned wires and buffers, original unclustered pin loads, local clock distribution wiring, and uncut X-Y grid wires.

13. The method of claim 12, further comprising the step of analyzing the final full simulation to provide final skew and waveforms at every clock pin.

14. In a X-Y grid tree clock distribution network, a method for tuning or optimizing the clock distribution network to reduce skew or an objective function including skew and other design goals, the method comprising the steps of:

(a) clustering the capacitance of local clock distribution wiring and pin capacitances to create a rectangular capacitance matrix, with one matrix element representing the total local wiring and capacitances associated by proximity with each X-Y grid intersection point;

(b) smoothing of the capacitance matrix to simulate a smoothing effect of X-Y grid wiring;

(c) creating a plurality of electrical simulation net lists, where the X-Y grid wires are cut to separate wiring at a sector tree level, resulting in a plurality of non-interacting sector net lists; and (d) tuning each sector net list to reduce one or more of power; wiring; and skew; wherein the capacitance matrix represents an approximation of the effects of neighboring sectors of said each sector net list.

15. The method of claim 14, further comprising the steps of:

tuning network parameters selected from a group consisting of: buffer sizes; signal wire widths; signal wire to shield spaces; and shield wire widths, using a conjugate gradient method.

16. The method of claim 14, further comprising the steps of:

calculation of delays, transition times, and sensitivities using a RICE reduced order interconnect modeling technique.

17. The method of claim 14, further comprising the steps of:

creating and transiently simulating a full net list for final simulation and checking, the net list including one or more of: tuned wires and buffers; original unclustered pin loads; local clock distribution wiring; and uncut X-Y grid wires.

18. The method of claim 17, further comprising the step of analyzing the final simulation to provide final skew and waveforms at every clock pin.

* * * * *